(12) United States Patent
Clark, Jr. et al.

(10) Patent No.: US 8,350,338 B2
(45) Date of Patent: Jan. 8, 2013

(54) SEMICONDUCTOR DEVICE INCLUDING HIGH FIELD REGIONS AND RELATED METHOD

(75) Inventors: William F. Clark, Jr., Essex Junction, VT (US); Yun Shi, South Burlington, VT (US)

(73) Assignee: International Business Machines Corporations, Armonk, NY (US)

(*) Notice: Subject to any disclaimer, the term of this patent is extended or adjusted under 35 U.S.C. 154(b) by 0 days.

(21) Appl. No.: 13/023,042

(22) Filed: Feb. 8, 2011

(65) Prior Publication Data
US 2012/0199906 A1 Aug. 9, 2012

(51) Int. Cl.
*H01L 23/013* (2006.01)
(52) U.S. Cl. ........ 257/393; 257/406; 257/492; 438/140; 438/301
(58) Field of Classification Search .................. 257/393, 257/406, 492; 438/140, 301
See application file for complete search history.

(56) References Cited

U.S. PATENT DOCUMENTS

| | | | |
|---|---|---|---|
| 5,315,144 A * | 5/1994 | Cherne | 257/351 |
| 6,424,007 B1 | 7/2002 | Disney | |
| 6,768,171 B2 * | 7/2004 | Disney | 257/342 |
| 6,903,421 B1 | 6/2005 | Huang et al. | |
| 7,023,032 B1 | 4/2006 | Doyle et al. | |
| 7,115,958 B2 | 10/2006 | Disney et al. | |
| 7,187,028 B2 | 3/2007 | King | |
| 7,235,451 B2 * | 6/2007 | Hao et al. | 438/306 |
| 2002/0036328 A1 * | 3/2002 | Richards et al. | 257/401 |
| 2009/0140372 A1 | 6/2009 | Hodel et al. | |

\* cited by examiner

*Primary Examiner* — Howard Weiss
*Assistant Examiner* — Steven Rao
(74) *Attorney, Agent, or Firm* — Michael J. LeStrange; Hoffman Warnick LLC

(57) ABSTRACT

A semiconductor device is disclosed. In an embodiment, a semiconductor device includes a N-well within a P-well in a silicon layer, the silicon layer positioned atop a buried oxide layer of a silicon-on-insulator (SOI) substrate; a first source region and a second source region within a portion of the P-well; a first drain region and a second drain region within a portion of the P-well and within a portion of the N-well; and a gate positioned atop the N-well, wherein a lateral high field region is generated between the N-well and the P-well and a vertical high field region is generated between the gate and the N-well. A related method is disclosed.

19 Claims, 15 Drawing Sheets

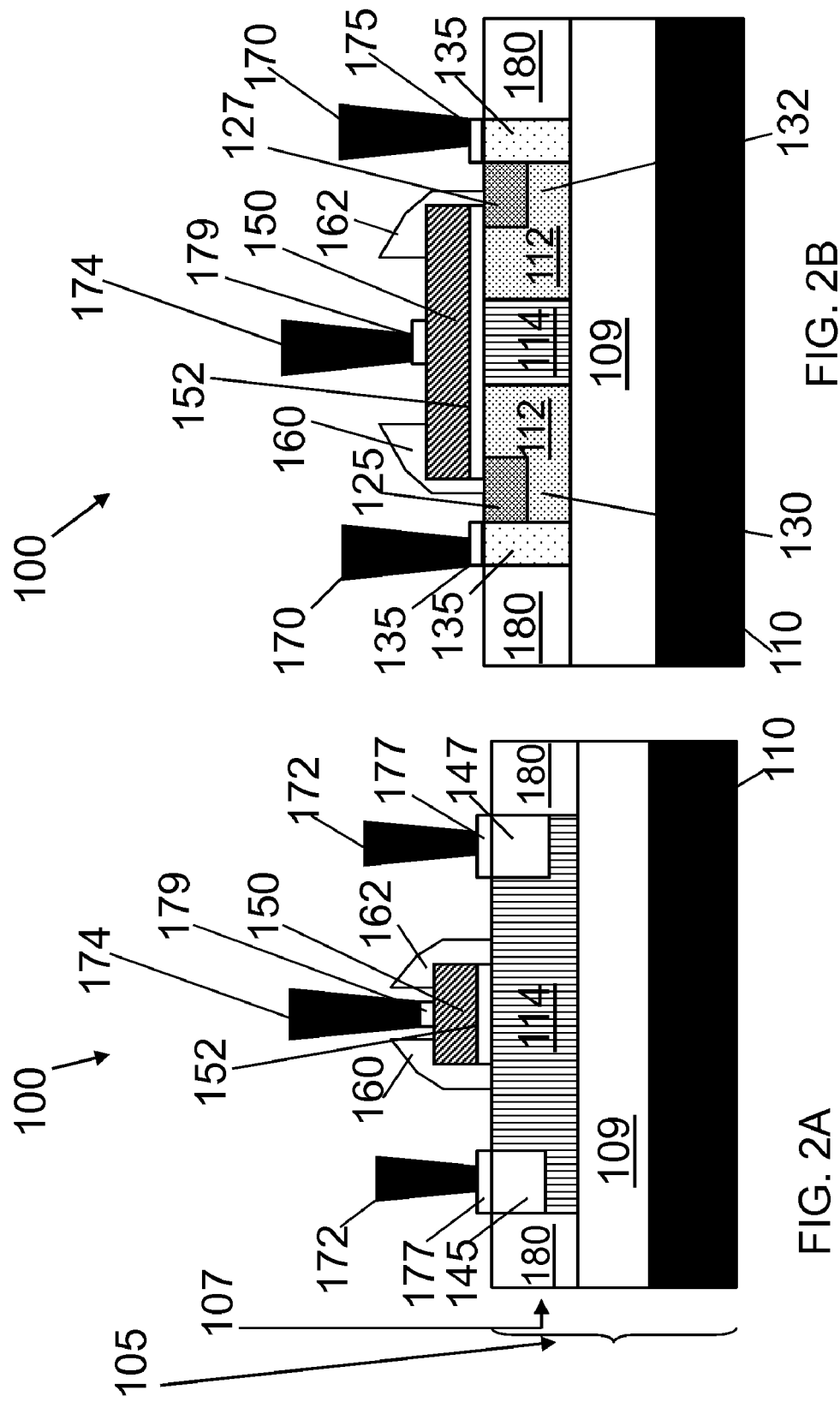

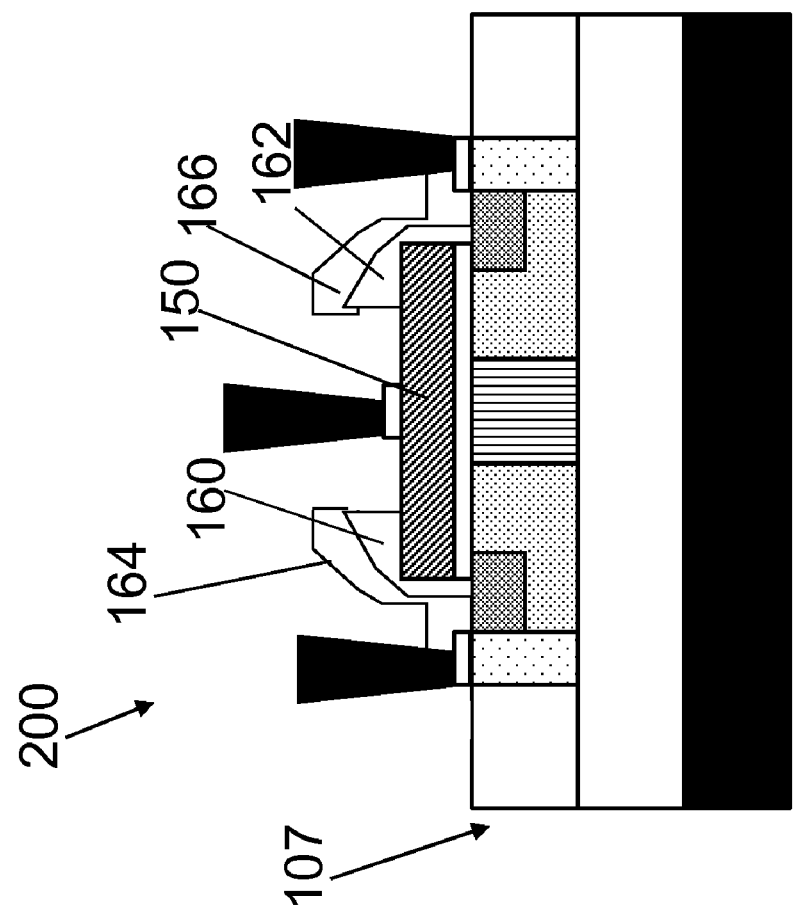
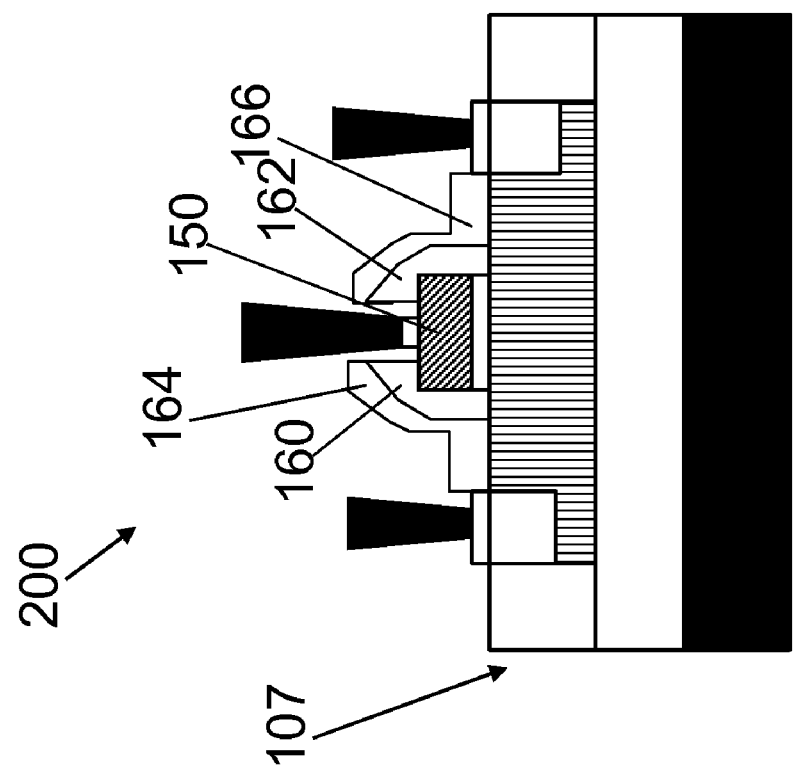

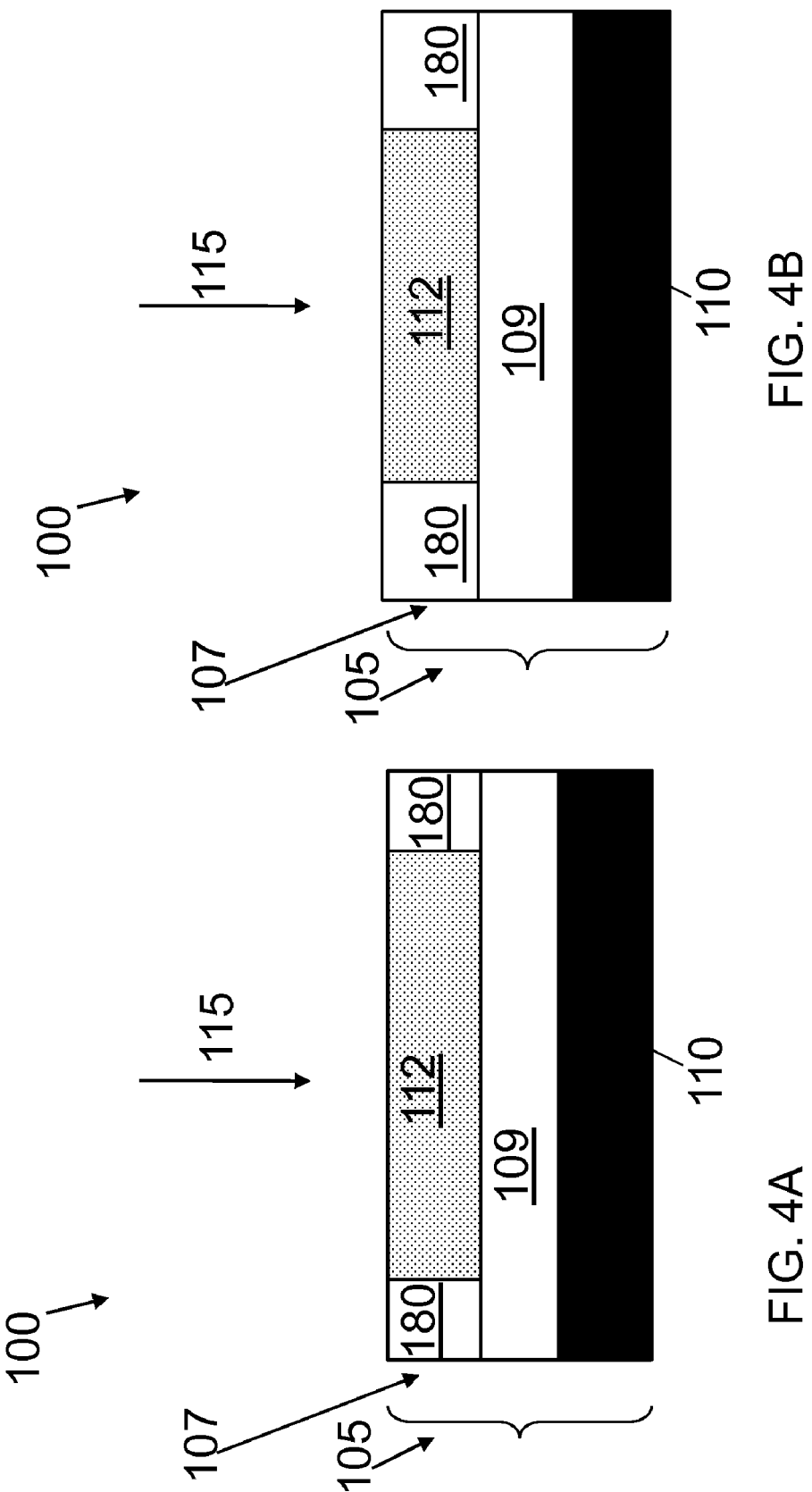

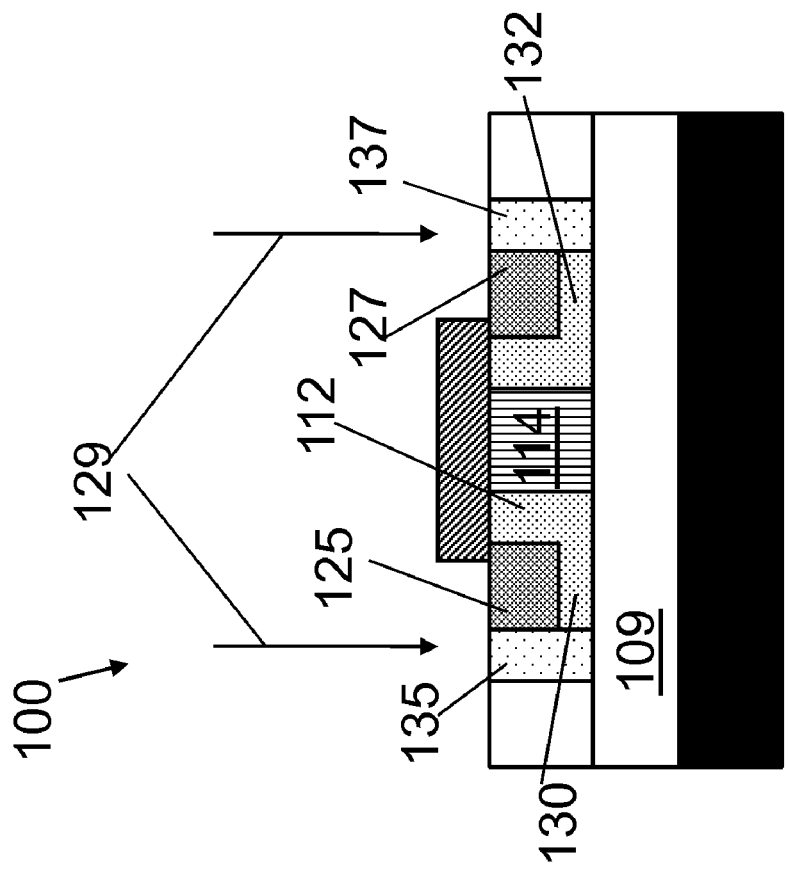
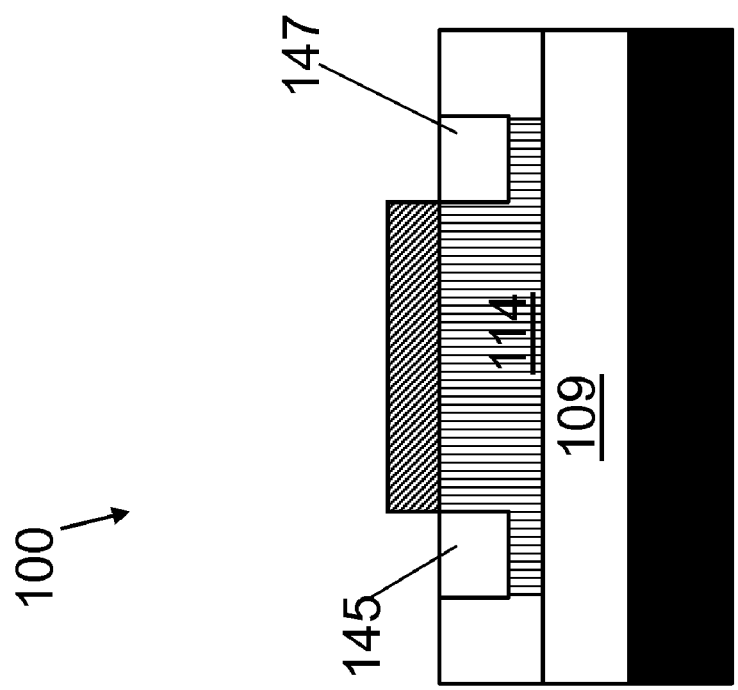

SEMICONDUCTOR DEVICE INCLUDING HIGH FIELD REGIONS AND RELATED METHOD

TECHNICAL FIELD

Embodiments of this disclosure relate generally to semiconductor devices and, more particularly, to a semiconductor device including high field regions and a related method.

BACKGROUND

Typically, in thin film silicon-on-insulator (SOI) technology, it may be desired to build a field-effect transistor (FET) with a high field region. Conventional methods include building a surface lightly doped drain (LDD) device or a shallow trench isolation (STI) structure to handle the high field. However, a surface LDD device may be too sensitive to hot carrier injection. Further, a STI structure built to handle a high field cannot be built on a structure with thin film SOI technology.

BRIEF SUMMARY

A first aspect of the disclosure provides a semiconductor device comprising: a N-well within a P-well in a silicon layer, the silicon layer positioned atop a buried oxide layer of a silicon-on-insulator (SOI) substrate; a first source region and a second source region within a portion the P-well; a first drain region and a second drain region within a portion of the P-well and a portion of the N-well; and a gate positioned atop the N-well, wherein a lateral high field region is generated between the N-well and the P-well and a vertical high field region is generated between the gate and the N-well.

A second aspect of the disclosure provides a structure comprising: a silicon-on-insulator (SOI) substrate including a silicon layer positioned atop a buried oxide layer; a N-well within a P-well in the silicon layer; a first and a second N-doped source region within a portion of the P-well; a first and a second N-doped drain region within a portion of the P-well and a portion of the N-well, wherein the first and second N-doped drain regions are substantially perpendicular to the first and second N-doped source regions; a first and a second P-doped contact region in the silicon layer adjacent to the first and the second N-doped source regions; and a gate positioned atop the N-well, wherein a lateral high field region is generated between the N-well and the P-well and a vertical high field region is generated between the gate and the N-well.

A third aspect of the disclosure provides a method of forming a semiconductor device, the method comprising: forming a P-well in a silicon layer of a silicon-on-insulator (SOI) substrate, the silicon layer positioned atop a buried oxide layer; forming a N-well within the P-well; forming a gate atop the N-well, wherein a lateral high field region is generated between the N-well and the P-well and a vertical high field region is generated between the gate and the N-well; simultaneously forming a first and a second source region in a portion of the P-well and a first and a second drain region in a portion of the P-well and a portion of the N-well; and forming a first and a second contact region for the P-well.

These and other aspects, advantages and salient features of the invention will become apparent from the following detailed description, which, when taken in conjunction with the annexed drawings, where like parts are designated by like reference characters throughout the drawings, disclose embodiments of the invention.

BRIEF DESCRIPTION OF THE DRAWINGS

The above and other aspects, features and advantages of the invention will be better understood by reading the following more particular description of the invention in conjunction with the accompanying drawings.

FIGS. 2A-2B show cross-sectional views of a semiconductor device according to an embodiment of the invention.

FIGS. 3A-3B show cross-sectional views of a semiconductor device according to an embodiment of the invention.

FIGS. 4A-4B, 5, 6A-6B, 7, 8A-8B, 9, 10A-10B, 11, 12A-12B, 13, 14A-14B, and 15A-15B show a method of forming a semiconductor device according to embodiments of the invention.

Figure 1:
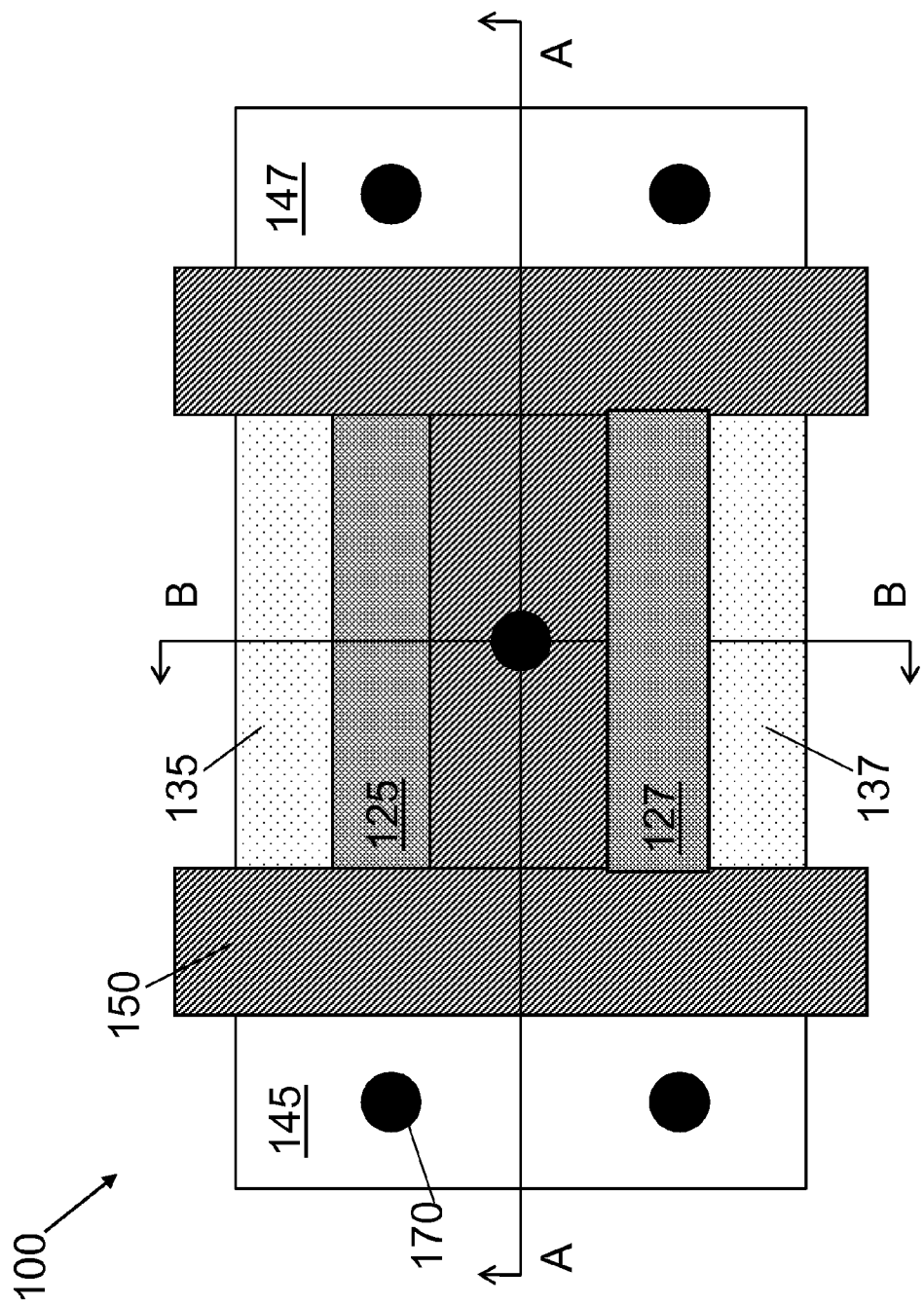
FIG. 1 shows a top view of a semiconductor device according to an embodiment of the invention.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

FIG. 1 shows a top view of a semiconductor device 100 according to an embodiment of this invention. FIGS. 2A and 2B show cross-sectional views of semiconductor device 100 along cut A-A and cut B-B of FIG. 1, respectively.

Referring now to FIGS. 1 and 2A-2B, semiconductor device 100 may include a silicon-on-insulator (SOI) substrate 105. SOI substrate 105 may include a first silicon layer 107 positioned atop a buried oxide layer 109. Buried oxide layer 109 may be positioned atop a second silicon layer 110. First silicon layer 107 may include a P-well 112. A N-well 114 may be within P-well 112 in first silicon layer 107. N-well 114 is along the axis of cut A-A in FIG. 1. As such, in FIG. 2A, only N-well 114 may be shown. FIG. 2B shows N-well 114 within P-well 112. P-well may also include a first source region 125 and a second source region 127. First source region 125 and second source region 127 may be doped N-type. As best seen in FIG. 2B, first source region 125 and second source region 127 may be formed within a portion of P-well 112. A first portion 130 of P-well 112 may be between first source region 125 and buried oxide layer 109. A second portion 132 of P-well 112 may be between second source region 127 and buried oxide layer 109.

Semiconductor device 100 may also include a first drain region 145 and a second drain region 147. First drain region 145 and second drain region 147 may be doped N-type. As best seen in FIG. 2A, first drain region 145 and second drain region 147 may be formed within a portion of N-well 114. Since N-well 114 is within P-well 112 and N-well is along the axis of cut A-A in FIG. 1, first drain region 145 and second drain region 147 may also be formed within a portion of P-well 112. First source region 125 and second source region 127 may be substantially perpendicular to first drain region 145 and second drain region 147.

Semiconductor device 100 may also include a gate 150 positioned atop N-well 114. Gate 150 may be formed in a "H" shape, as seen in FIG. 1. As seen in FIG. 2B, gate 150 may also extend over P-well 112 and first source region 125 and second source region 127. A lateral high field region is located between N-well 114 and P-well 112. A vertical high field region is located between gate 150 and N-well 114. Gate 150 may also include a gate oxide 152 between gate 150 and N-well 114.

Semiconductor device 100 may also include a first contact region 135 and a second contact region 137. First contact region 135 and second contact region 137 may be doped P-type. First and second P-doped contact regions 135, 137 may be in first silicon layer 107 adjacent to first and second N-doped source regions 125, 127. Other portions of semiconductor device 100 may include shallow trench regions 180 and body contacts 170. P-well 112 may be within shallow trench regions 180. As seen in FIG. 2A, drain regions 145, 147 are contacted through drain contacts 172 and drain silicide portions 177. As seen in FIG. 2B, contact regions 135, 137 may be contacted through body contacts 170 and body silicide portions 175. As seen in FIGS. 2A-2B, gate 150 may be contacted through gate contact 174 and gate silicide portion 179. Semiconductor device 100 may also include a first dielectric spacer 160 and a second dielectric spacer 162 substantially surrounding gate 150.

Turning now to FIGS. 3A and 3B, a cross-sectional view of semiconductor device 200 according to an embodiment of the invention is shown. Semiconductor device 200 is similar to semiconductor device 100. However, semiconductor device 200 may include a first raised source region 164 and a second raised source region 166. First raised source region 164 and second raised source region 166 may be positioned on a top surface of first silicon layer 107 and substantially surround gate 150. First dielectric spacer 160 and second dielectric spacer 162 may be positioned between first and second raised source regions 164, 166 and gate 150.

A method of forming a semiconductor device 100 according to an embodiment of the invention will now be discussed. Turning now to FIGS. 4A and 4B, SOI substrate 105 may be provided. SOI substrate may include first silicon layer 107 positioned atop buried oxide layer 109. Buried oxide layer 109 may be positioned atop second silicon layer 110. P-well 112 may be formed in first silicon layer 107 of SOI substrate 105. P-well 112 may be formed using, for example, an ion implant 115. P-well 112 may be formed, such that, shallow trench isolation regions 180 are formed on either side of P-well 112.

Figure 5:
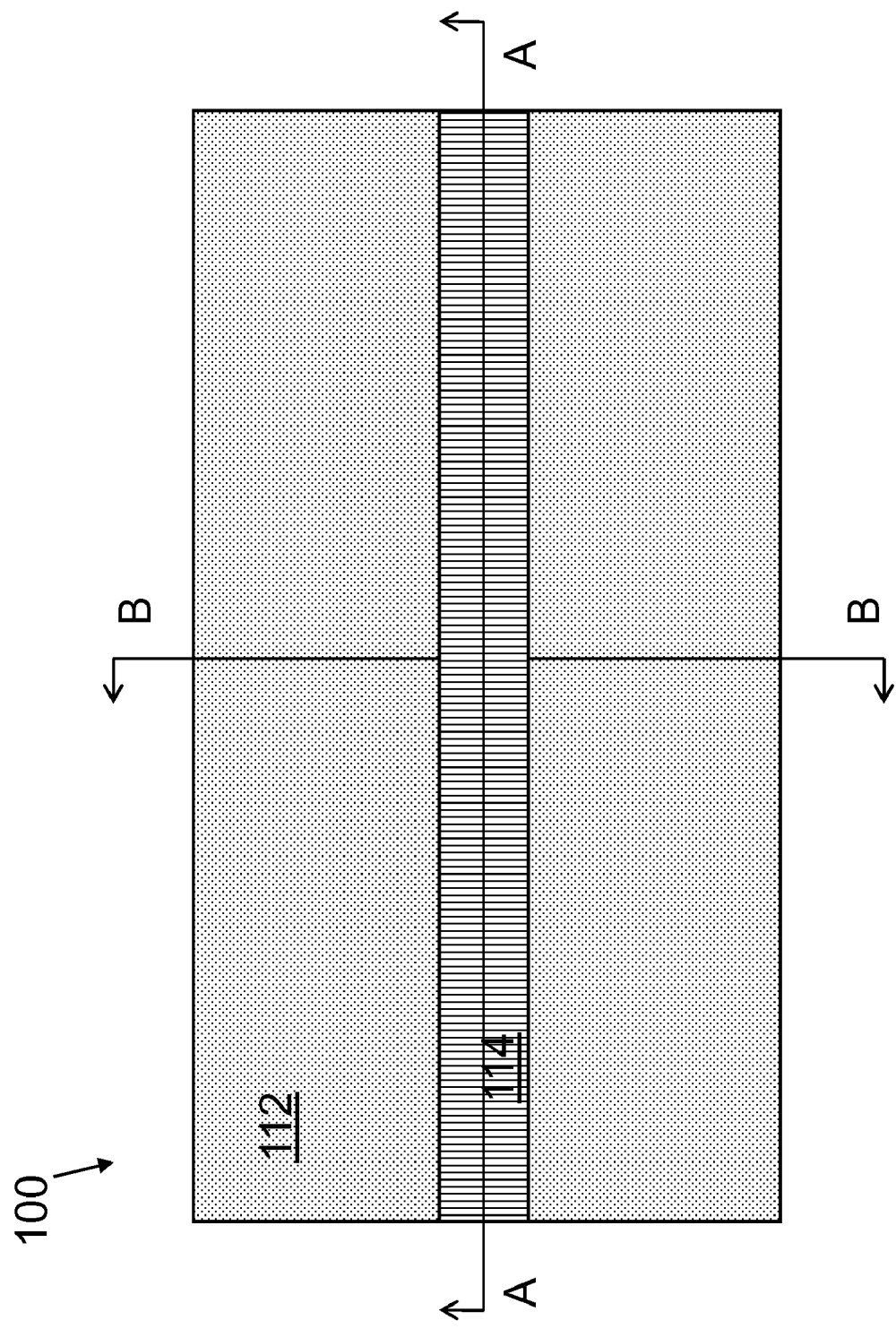
Figure 6B:
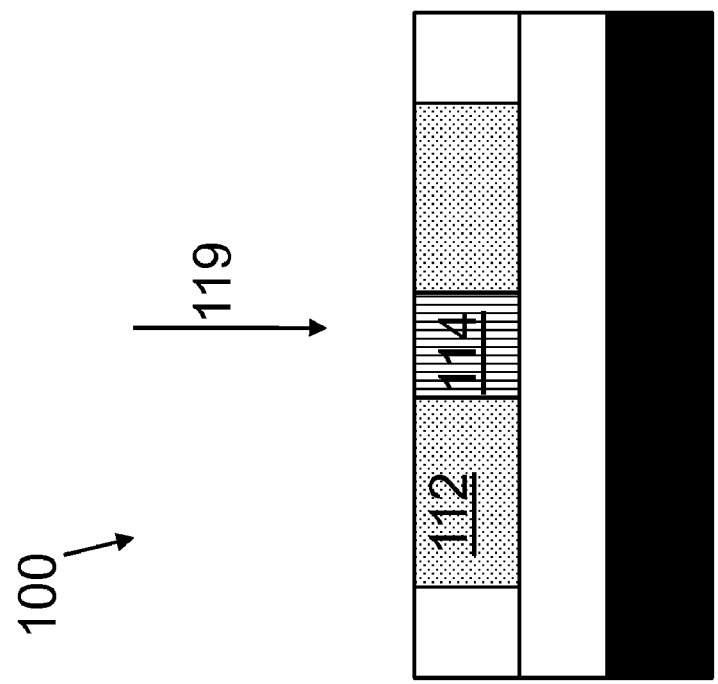
Figure 6A:
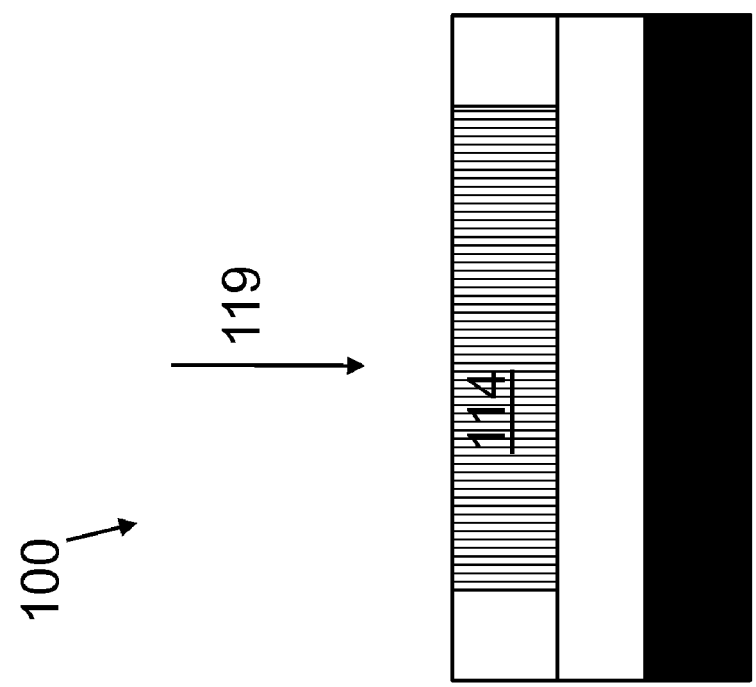
Figure 7:
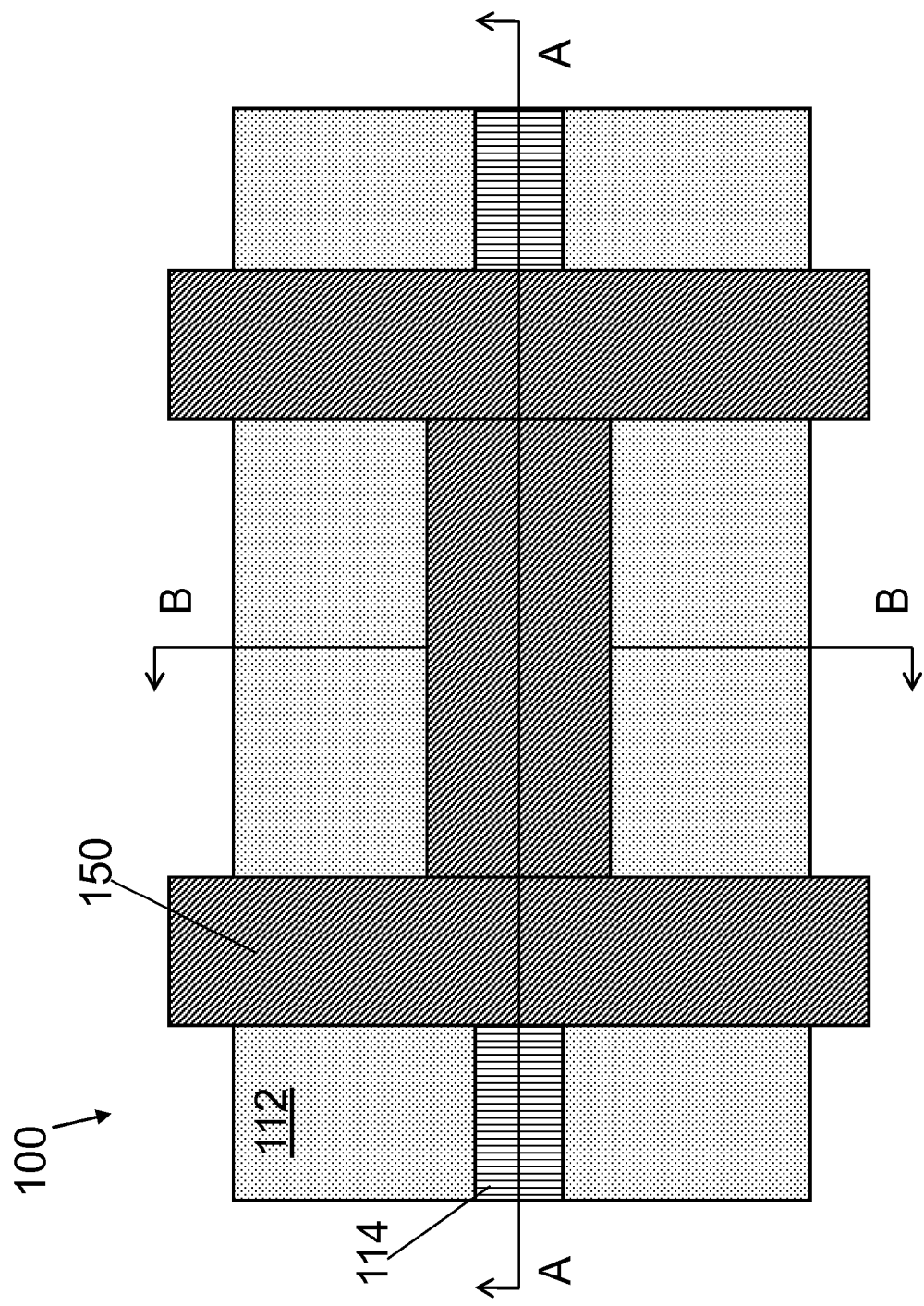
Figure 8B:
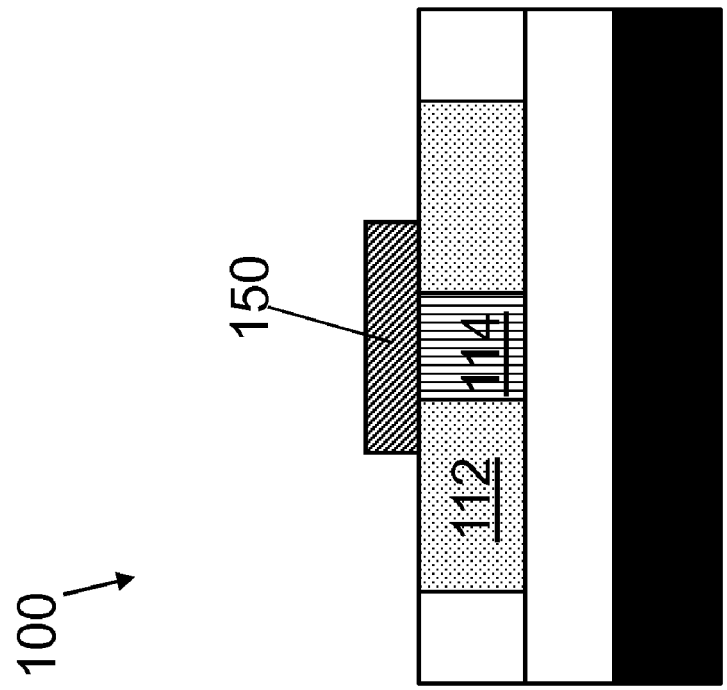
Figure 8A:
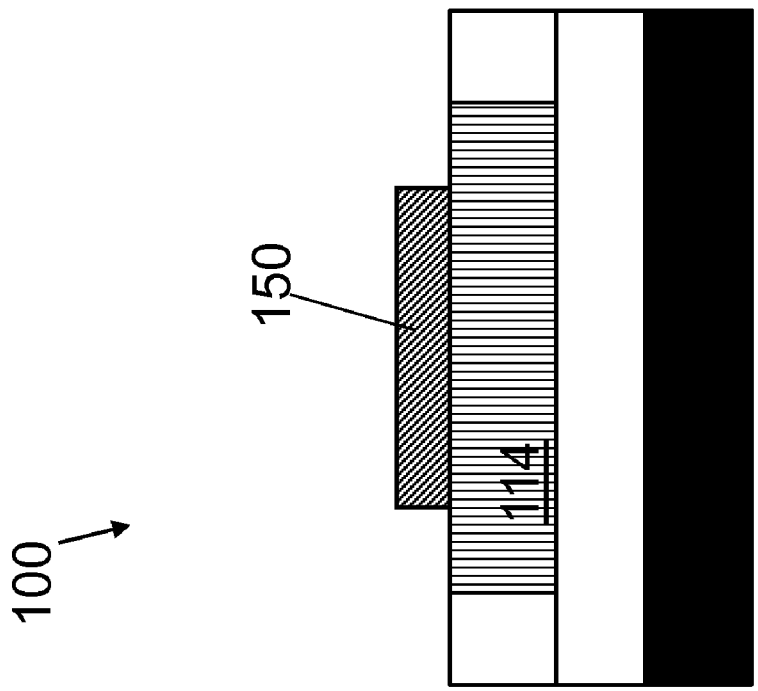
Figure 9:
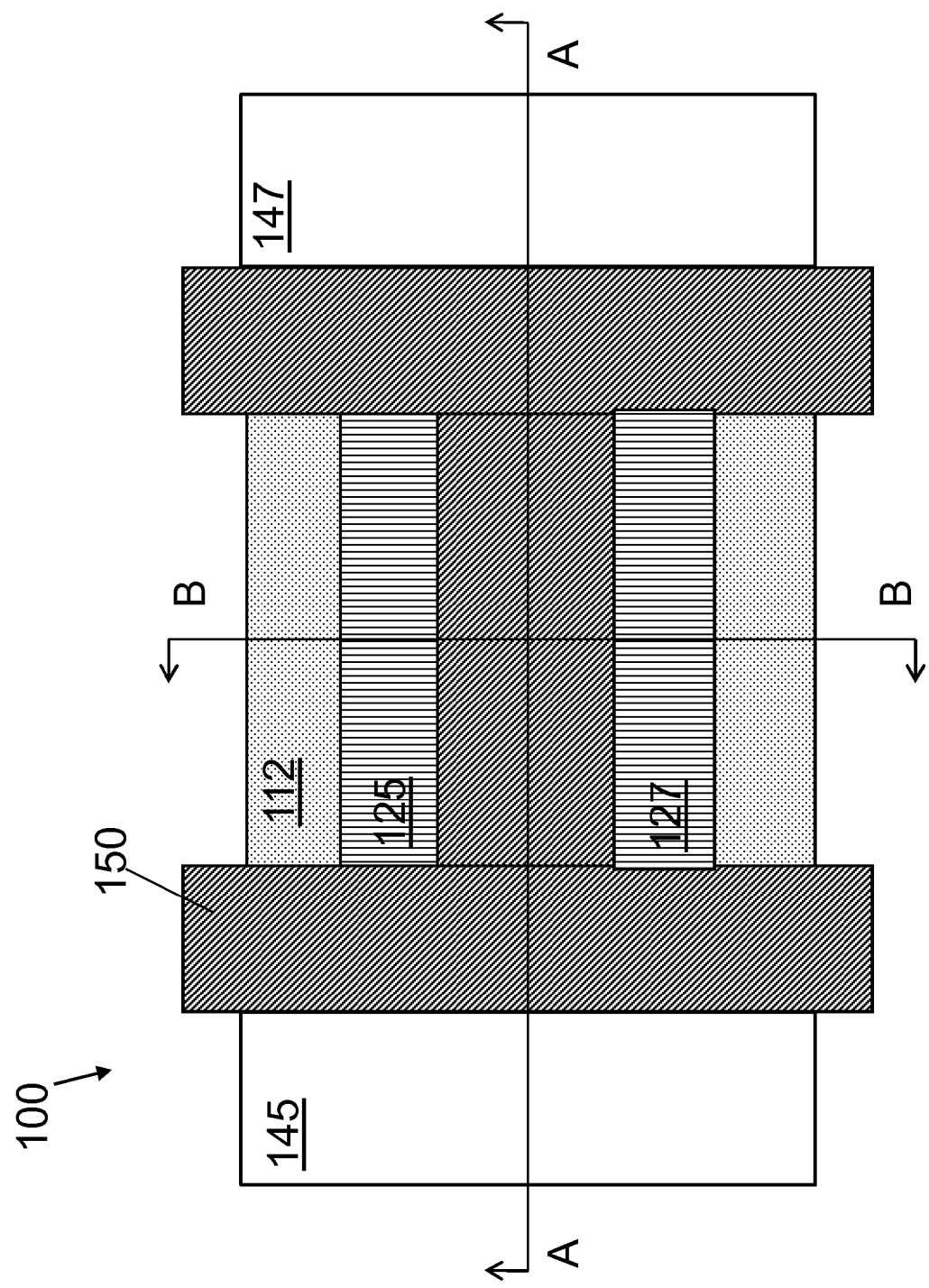
Figure 10B:
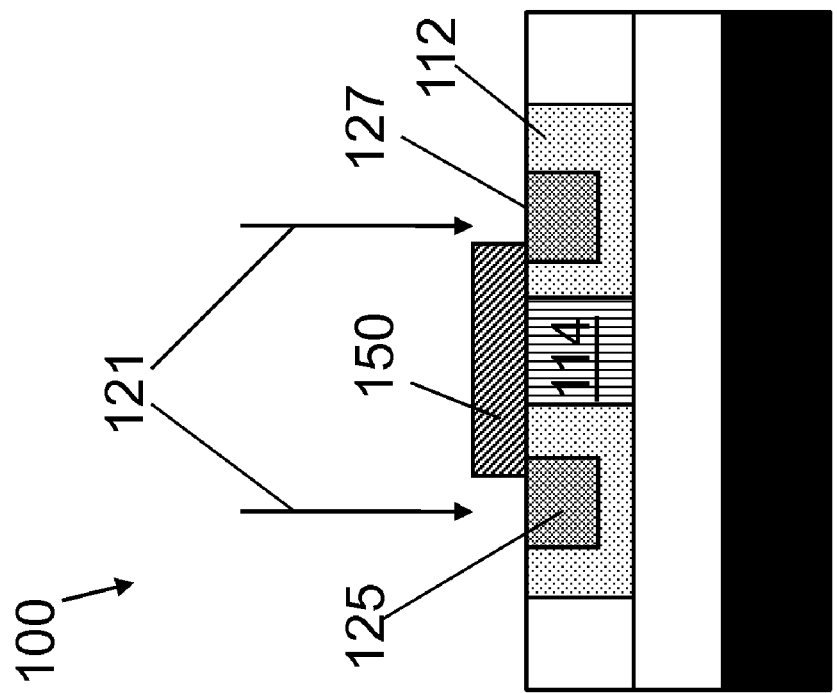
Figure 10A:
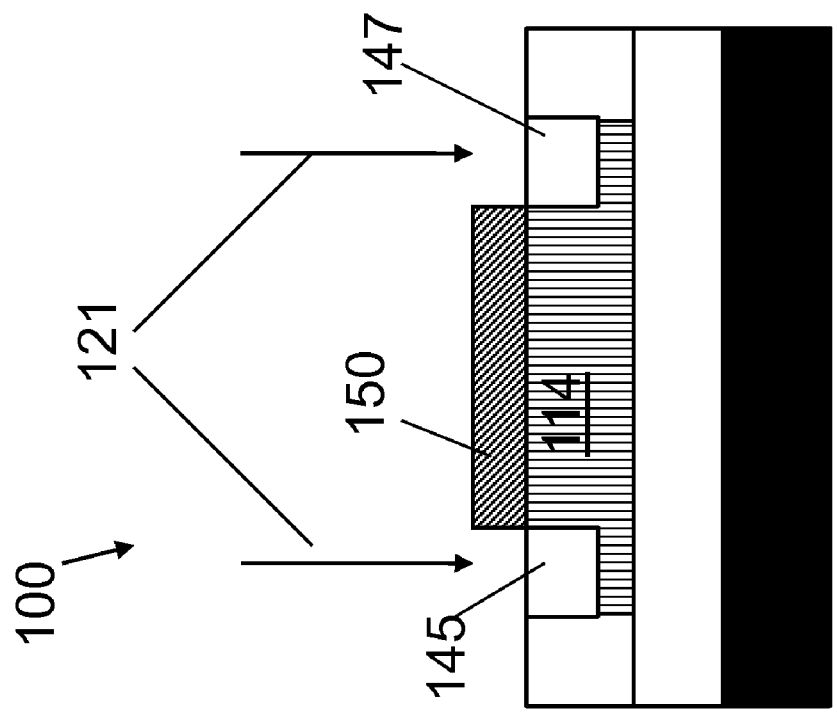

Turning now to FIGS. 5 and 6A-6B, N-well 114 may be formed within P-well 112. As seen in FIG. 5, N-well 114 may extend along the axis of cut A-A. N-well 114 may be formed by, for example, an ion implant 119. Next, gate 150, in the shape of an "H", may be formed atop N-well 114 (FIGS. 7 and 8A-8B). Gate 150 may extend over P-well 112. For clarity purposes, gate oxide 152 is not shown; however, it is understood that gate oxide 152 may be formed before gate 150 is formed. Next, as seen in FIGS. 9 and 10A-10B, first and second source regions 125, 127 and first and second drain regions 145, 147 may be simultaneously formed. First and second source regions 125, 127 and first and second drain regions 145, 147 may be formed by, for example, an ion implant, and may be doped N-type. As seen in FIG. 9, first and second source regions 125, 127 may be formed in a portion of P-well 112. First and second source regions 125, 127 may be formed such that gate 150 may overlap first and second source regions 125, 127. First and second drain regions 145, 147 may be formed in a portion of P-well 112 and a portion of N-well 114 (FIGS. 10A-10B). First source region 125 and second source region 127 may be substantially perpendicular to first drain region 145 and second drain region 147. First and second source regions 125, 127 and first and second drain regions 145, 147 may be formed by, for example, ion implant 121.

Note that although N-well 114 is no longer depicted in FIG. 9, N-well 114 is still in P-well 112 and may be seen in cross-sectional FIGS. 10A-10B.

Figure 11:
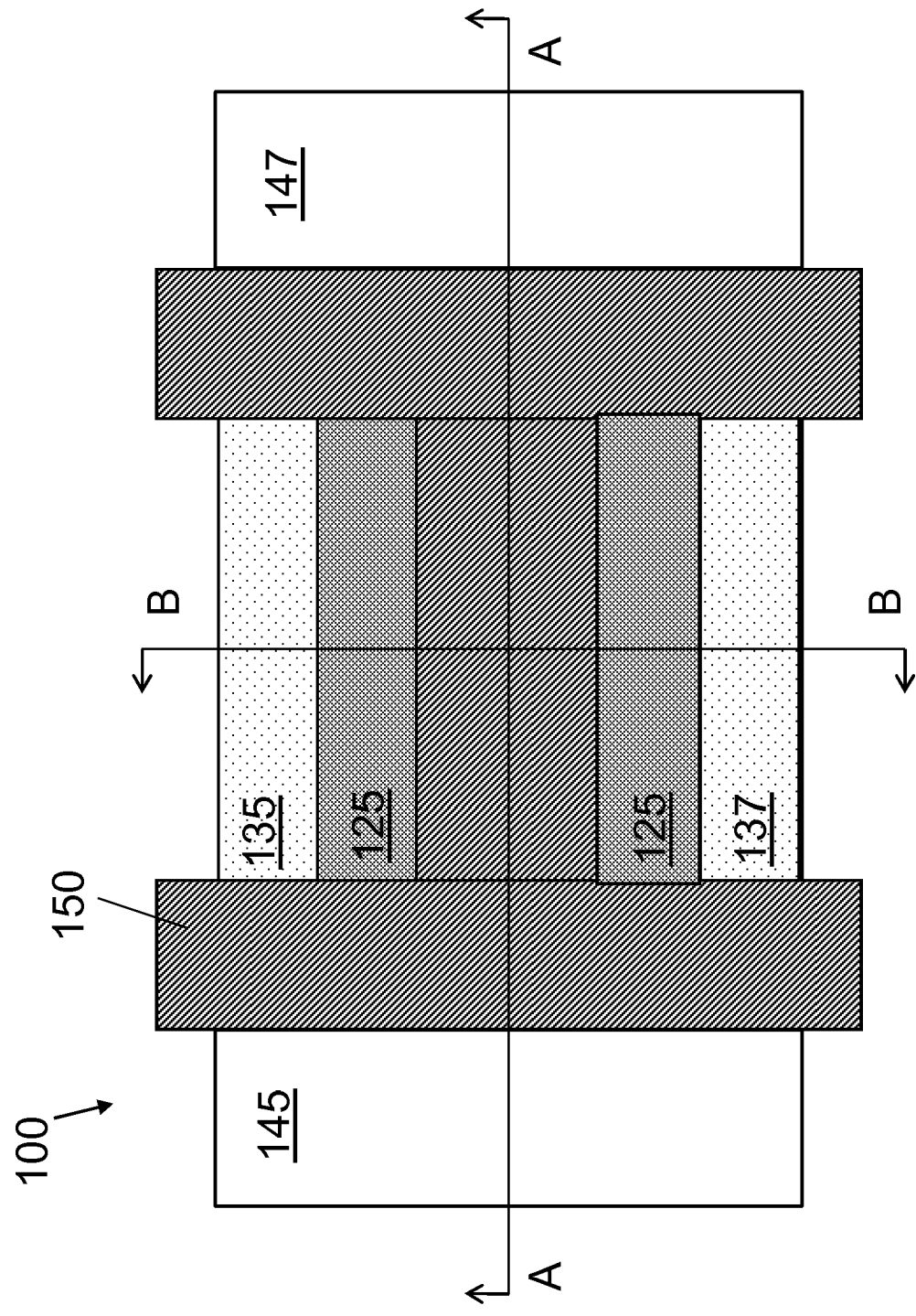

Next, as seen in FIGS. 11 and 12A-12B, first and second contact regions 135, 137 may be formed for P-well 112. First and second contact regions 135, 137 may be formed by, for example, an ion implant 129 (FIG. 12B). First and second contact regions 135, 137 may doped P-type. As seen in FIG. 11, first and second contact regions 135, 137 may be adjacent to first and second source regions 125, 127, respectively. As seen in FIG. 12B, first portion 130 of P-well 112 may be between first source region 125 and buried oxide layer 109 and second portion 132 of P-well 112 may be between second source region 127 and buried oxide layer 109. Note that, cut A-A in FIG. 12A does not show first and second contact regions 135, 137.

Figure 13:
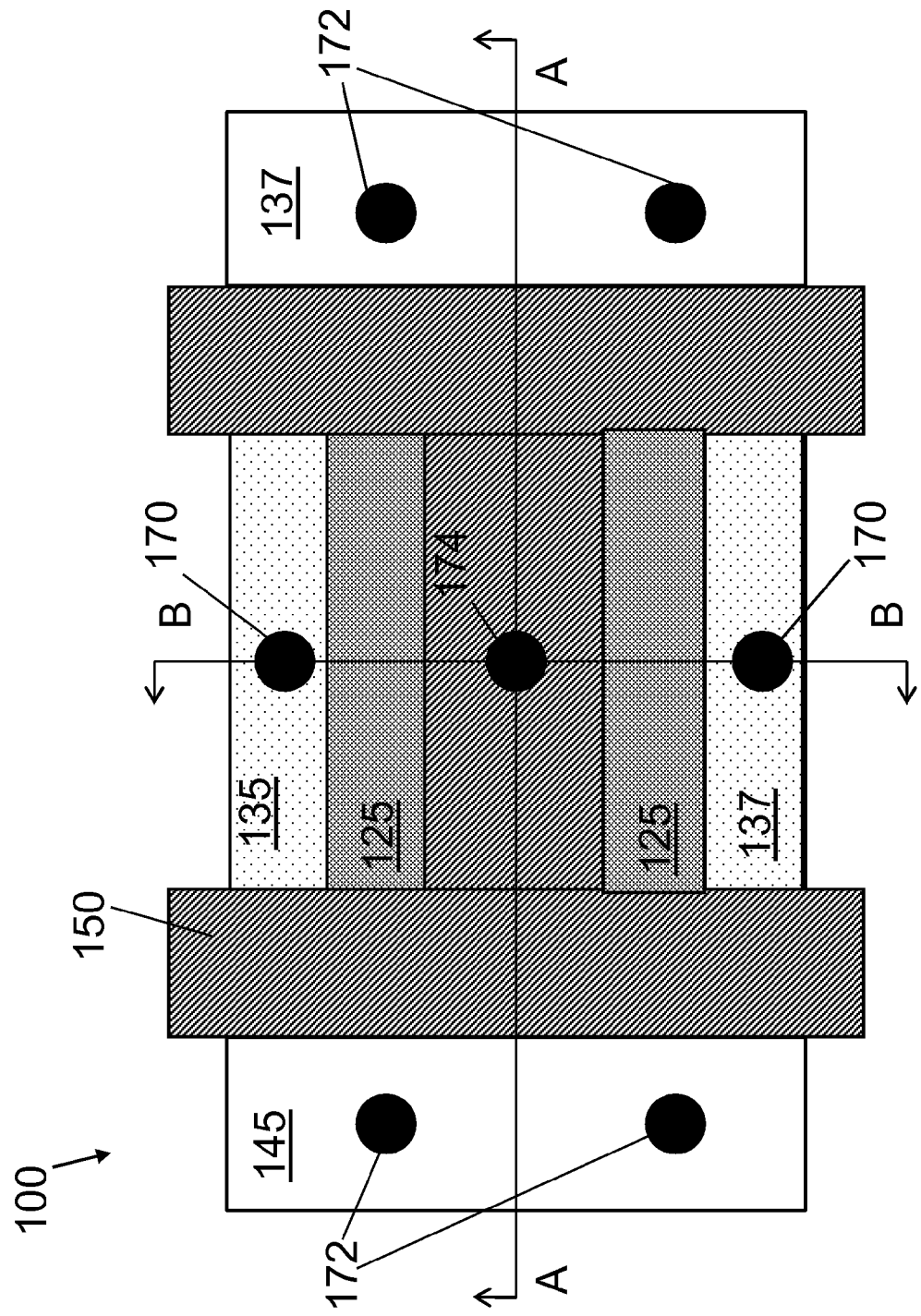
Figure 14B:
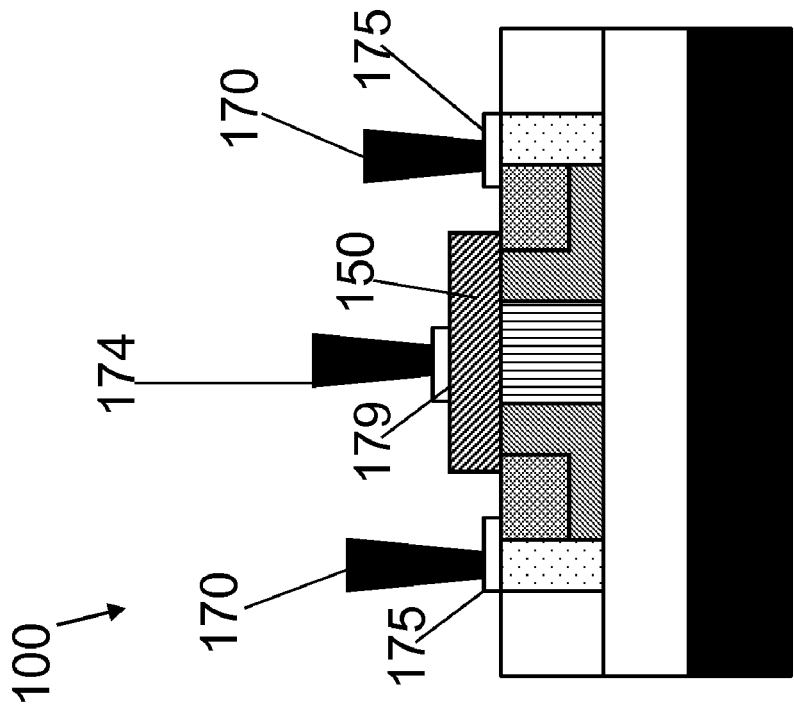
Figure 14A:
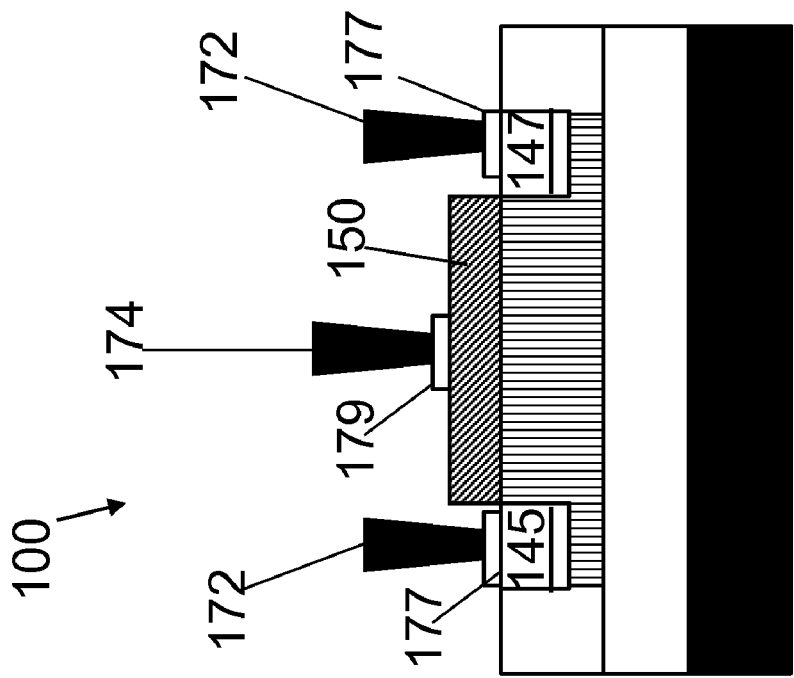

Turning now to FIGS. 13 and 14A-14B, contacts, such as body contacts 170, drain contacts 172, and gate contacts 174 may be formed at various portions of semiconductor 100. For example, body contacts 170 may be formed over contact regions 135, 137. Drain contacts 172 may be formed over drain regions 145, 147. Gate contact 174 may be formed over gate 150. As seen in FIGS. 14A-14B, silicide portions 175, 177, 179 may be formed below each contact 170, 172, 174.

Figure 15B:
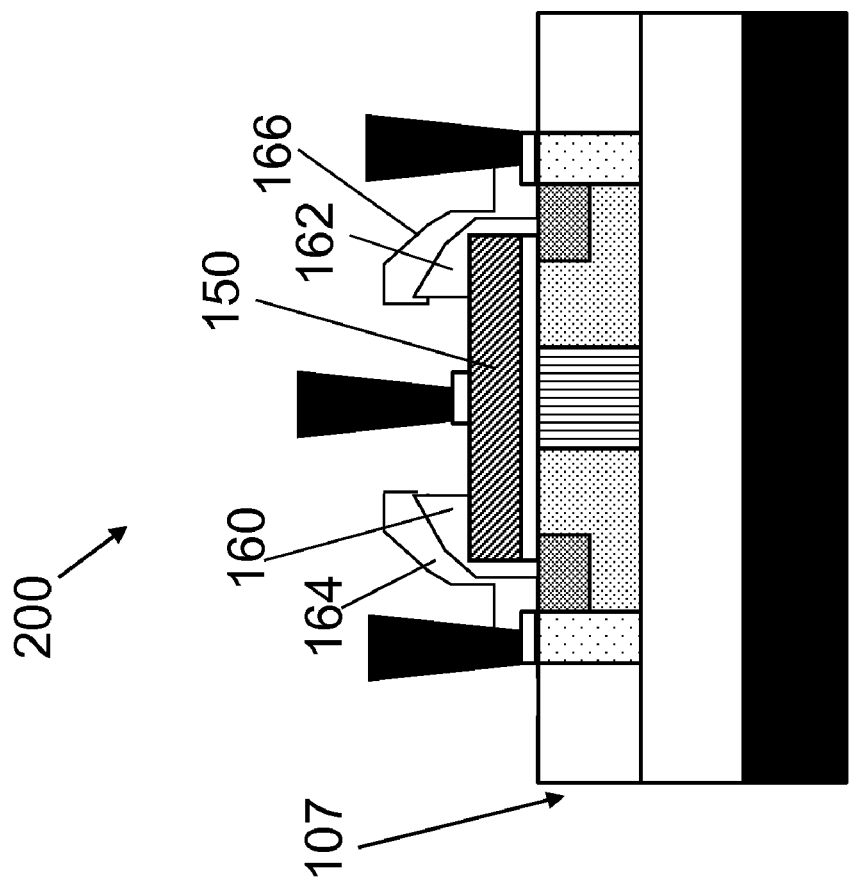
Figure 15A:
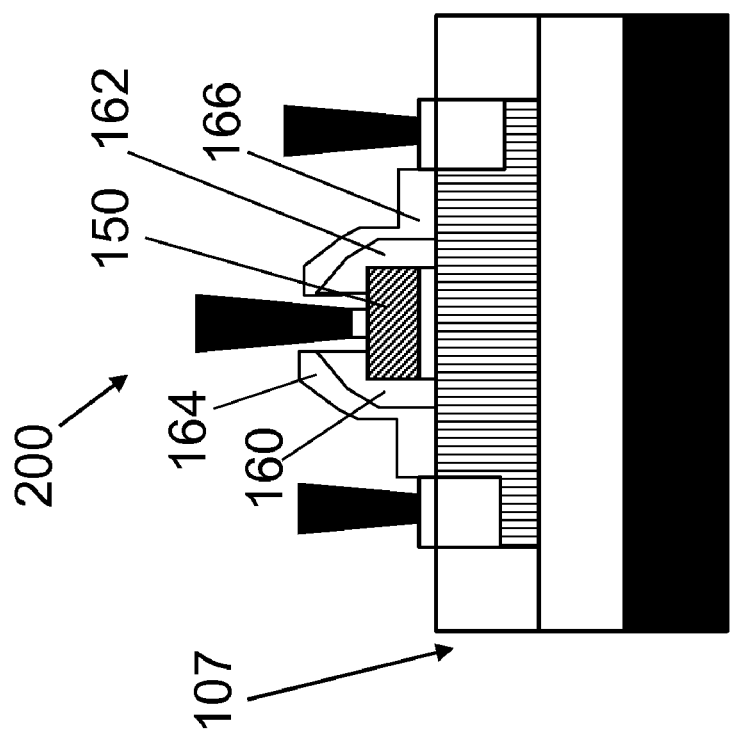

Turning now to FIGS. 15A-15B, it is understood that semiconductor device 200 may be formed using a similar method, as discussed above. Semiconductor device 200 may further include first and second raised source regions 164, 166. First and second raised source regions 164, 166 may be formed on a top surface of first silicon layer 107 and substantially surround gate 150. First and second dielectric spacers 160, 162 may be formed between first and second raised source regions 164, 166 and gate 150, respectively.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While various embodiments are described herein, it will be appreciated from the specification that various combinations of elements, variations or improvements therein may be made by those skilled in the art, and are within the scope of the invention. In addition, many modifications may be made to adapt a particular situation or material to the teachings of the invention without departing from essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A semiconductor device comprising:
   a N-well within a P-well in a silicon layer, the silicon layer positioned atop a buried oxide layer of a silicon-on-insulator (SOI) substrate;
   a first source region within a first portion of the P-well and a second source region within a second portion of the P-well;
   a first drain region and a second drain region within both a portion of the P-well and within a portion of the N-well, wherein the first and second drain regions are substantially perpendicular to the first and second source regions; and
   a gate positioned atop the N-well, wherein a lateral high field region is generated between the N-well and the P-well and a vertical high field region is generated between the gate and the N-well.

2. The semiconductor device of claim 1, further comprising a first and a second raised source region positioned on a top surface of the silicon layer and substantially surrounding the gate.

3. The semiconductor device of claim 2, further comprising a first and a second dielectric spacer positioned between the first and the second raised source region and the gate.

4. The semiconductor device of claim 1, wherein the first and the second source regions are N-type doped.

5. The semiconductor device of claim 1, wherein the first and second drain regions are N-type doped.

6. The semiconductor device of claim 1, wherein a first portion of the P-well is between the first source region and the buried oxide layer and a second portion of the P-well is between the second source region and the buried oxide layer.

7. The semiconductor device of claim 1, wherein the gate extends over the P-well and the first and second source regions.

8. The semiconductor device of claim 1, further comprising a gate oxide between the gate and the N-well.

9. A structure comprising:
   a silicon-on-insulator (SOI) substrate including a silicon layer positioned atop a buried oxide layer;
   a N-well within a P-well in the silicon layer;
   a first N-doped source region within a first portion of the P-well and a second N-doped source region within a second portion of the P-well;
   a first and a second N-doped drain region within both a portion of the P-well and within a portion of the N-well, wherein the first and second N-doped drain regions are substantially perpendicular to the first and second N-doped source regions;
   a first and a second P-doped contact region in the silicon layer adjacent to the first and the second N-doped source regions; and
   a gate positioned atop the N-well, wherein a lateral high field region is generated between the N-well and the P-well and a vertical high field region is generated between the gate and the N-well.

10. The structure of claim 9, further comprising a first and a second raised source regions positioned on a top surface of the silicon layer and substantially surrounding the gate.

11. The structure of claim 9, wherein a first portion of the P-well is between the first N-doped source region and the buried oxide layer and a second portion of the P-well is between the second N-doped source region and the buried oxide layer.

12. The structure of claim 9, wherein the gate extends over the P-well and the first and second N-doped source regions.

13. The structure of claim 9, further comprising a gate oxide between the gate and the N-well.

14. A method of forming a semiconductor structure, the method comprising:
   forming a P-well in a silicon layer of a silicon-on-insulator (SOI) substrate, the silicon layer positioned atop a buried oxide layer;
   forming a N-well within the P-well;
   forming a gate atop the N-well, wherein a lateral high field region is generated between the N-well and the P-well and a vertical high field region is generated between the gate and the N-well;
   simultaneously forming a first source region in a first portion of the P-well and a second source region in a second portion of the P-well and a first and a second drain region in both a portion of the P-well and a portion of the N-well, wherein the first and second drain regions are substantially perpendicular to the first and second source regions; and
   forming a first and a second contact region for the P-well.

15. The method of claim 14, further comprising forming a first and a second raised source region on a top surface of the silicon layer and substantially surrounding the gate.

16. The method of claim 14, wherein a first portion of the P-well is between the first source region and the buried oxide layer and a second portion of the P-well is between the second source region and the buried oxide layer.

17. The method of claim 14, wherein the gate extends over the P-well and the first and second source region.

18. The method of claim 14, further comprising a gate oxide between the gate and the N-well.

19. The method of claim 14, wherein the first and the second source regions and the first and the second drain regions are N-doped.

* * * * *